(12) United States Patent
Bayram et al.

(10) Patent No.: US 9,245,747 B2
(45) Date of Patent: Jan. 26, 2016

(54) ENGINEERED BASE SUBSTRATES FOR RELEASING III-V EPITAXY THROUGH SPALLING

(71) Applicant: International Business Machines Corporation, Armonk, NY (US)

(72) Inventors: Can Bayram, Ossining, NY (US); Stephen W. Bedell, Wappingers Falls, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/267,250

(22) Filed: May 1, 2014

(65) Prior Publication Data

US 2015/0318168 A1    Nov. 5, 2015

(51) Int. Cl.
| | |
|---|---|
| H01L 33/00 | (2010.01) |
| H01L 21/02 | (2006.01) |
| H01L 21/304 | (2006.01) |
| H01L 21/306 | (2006.01) |

(52) U.S. Cl.
CPC ........ *H01L 21/0254* (2013.01); *H01L 21/0217* (2013.01); *H01L 21/02164* (2013.01); *H01L 21/02181* (2013.01); *H01L 21/02389* (2013.01); *H01L 21/02609* (2013.01); *H01L 21/304* (2013.01); *H01L 21/30604* (2013.01); *H01L 33/0075* (2013.01); *H01L 33/0079* (2013.01)

(58) Field of Classification Search
None
See application file for complete search history.

(56) References Cited

U.S. PATENT DOCUMENTS

| | | | | |
|---|---|---|---|---|
| 6,500,257 | B1 * | 12/2002 | Wang et al. | ...... 117/95 |
| 7,388,234 | B2 | 6/2008 | Hayashi et al. | |
| 7,977,701 | B2 | 7/2011 | Hayashi et al. | |
| 8,349,076 | B2 * | 1/2013 | Song et al. | ...... 117/90 |

(Continued)

FOREIGN PATENT DOCUMENTS

| | | |
|---|---|---|
| CN | 101465302 A | 6/2009 |
| CN | 101465302 B | 8/2010 |

(Continued)

OTHER PUBLICATIONS

Kazumasa Hiramatsu, "Epitaxial Lateral Overgrowth Techniques Used in Group III Nitride Epitaxy", J. Phys.: Condens. Matter, vol. 13, pp. 6961-6975, 2001.*

*Primary Examiner* — Marc Armand
*Assistant Examiner* — Younes Boulghassoul
(74) *Attorney, Agent, or Firm* — Scully, Scott, Murphy & Presser, P.C.; Louis J. Percello, Esq.

(57) ABSTRACT

A method for releasing a semiconductor layer with a reduced active area from a base substrate is provided. A patterned release layer is first formed between a semiconductor layer comprised of an III-V compound semiconductor material and formed by a lateral epitaxial overgrowth technique and a base substrate. The patterned release layer is in contact with a Group III nitride surface. The patterned release layer is composed of a material having a lower fracture toughness than that of the III-V compound semiconductor material and that of the base substrate so that a crack will initiate in the pattern release layer during the controlled spalling process. The semiconductor layer is released from the underlying base substrate along a spalling plane located at a portion of the semiconductor layer enclosing the patterned release layer and the base substrate.

20 Claims, 5 Drawing Sheets

(56) References Cited

U.S. PATENT DOCUMENTS

| | | | |
|---|---|---|---|
| 8,591,652 B2* | 11/2013 | Hennig et al. | 117/95 |
| 8,933,456 B2* | 1/2015 | Bedell et al. | 257/64 |
| 9,058,990 B1* | 6/2015 | Bayram et al. | H01L 21/0254 |
| 2002/0048964 A1* | 4/2002 | Yuasa et al. | 438/763 |
| 2003/0183157 A1* | 10/2003 | Usui et al. | 117/84 |
| 2010/0311250 A1* | 12/2010 | Bedell et al. | 438/759 |
| 2011/0048516 A1* | 3/2011 | Bedell et al. | 136/255 |
| 2012/0322244 A1* | 12/2012 | Bedell et al. | 438/478 |
| 2013/0316488 A1* | 11/2013 | Bedell et al. | 438/68 |
| 2013/0316538 A1* | 11/2013 | Bedell et al. | 438/691 |
| 2013/0316542 A1* | 11/2013 | Bedell et al. | 438/759 |
| 2015/0069420 A1* | 3/2015 | Paranjpe et al. | 257/79 |

FOREIGN PATENT DOCUMENTS

| | | |
|---|---|---|
| CN | 102367787 A | 8/2012 |
| CN | 102969425 A | 3/2013 |
| CN | 102983241 A | 3/2013 |
| CN | 103050587 A | 4/2013 |
| JP | 2000021789 A | 1/2000 |
| KR | 100721169 B1 | 5/2007 |

* cited by examiner

ENGINEERED BASE SUBSTRATES FOR RELEASING III-V EPITAXY THROUGH SPALLING

BACKGROUND

The present disclosure generally relates to a method of forming a semiconductor structure, and more particularly to a method of releasing a semiconductor structure containing at least one III-V compound semiconductor material from a base substrate.

III-V compound semiconductor materials are a unique group of semiconductor materials which can be used in a wide variety of applications including, for example, optoelectronics, photovoltaics and lighting. III-V compound semiconductor materials are composed of at least one element from Group III metals of the Periodic Table of Elements, i.e., aluminum (Al), gallium (Ga) and indium (In), and at least one element from Group V, e.g., nitrogen (N), phosphorus (P) and arsenic (As), of the Periodic Table of Elements. For example, Group III metals can form arsenide materials, such as GaAs, or phosphide materials such as GaP. GaAs is an III-V compound semiconductor widely used in microwave frequency integrated circuits, light emitting diodes and solar cells. GaP, another Group III-V semiconductor compound, is used in red, orange and green light emitting diodes (LEDs). Group III metals can also form nitrides by reacting with nitrogen. Examples of some common Group III nitrides are AlN, InN, GaN, GaAlN, and GaAlInN. By changing the composition of Al, Ga and/or In within a Group III nitride material, the Group III nitride material can be tuned along the electromagnetic spectrum; mainly from 210 nm to 1770 nm. This spectrum includes the visible LEDs, which are more than a 10 billion dollar industry with a forecasted double digit yearly growth rate. This continuous growth in LED demand enables the infrastructural build-up for the growth and fabrication of III-V compound semiconductor based devices.

Most of consumer-targeted devices based on epitaxial layers of III-V compound semiconductor materials are conventionally grown on sapphire. Some potential applications of these thin film devices have been hampered by the base substrates currently used, whose typical thickness is 100 times as large as that of the thin film devices. If the thin film semiconductor devices alone can be cleaved from the original base substrates and transferred onto other surfaces of arbitrary geometry or flexibility, the thin-film devices based on epitaxial layers of III-V compound semiconductor materials may have a wider field of applications, such as large area flexible displays and general lighting. As such, a method is needed which can be used to cleave epitaxial layers of III-V compound semiconductor materials from original base substrates.

SUMMARY

A method for releasing a semiconductor layer with a reduced active area from a base substrate is provided. A patterned release layer is first formed between a semiconductor layer comprised of an III-V compound semiconductor material and formed by a lateral epitaxial overgrowth technique and a base substrate. The patterned release is in contact with a Group III nitride surface. The patterned release layer is composed of a material having a lower fracture toughness than that of the III-V compound semiconductor material and that of the base substrate so that a crack will initiate in the pattern release layer during the controlled spalling process. The semiconductor layer is released from the underlying base substrate along a spalling plane located at a portion of the semiconductor layer enclosing the patterned release layer.

In one aspect of the present disclosure, a method of forming a semiconductor structure is provided. The method includes forming a release layer over a base substrate. The release layer is in contact with a Group III nitride surface. A patterned release layer that includes at least one opening and a plurality of wing regions is then formed. Each wing region is oriented along a <1$\bar{1}$00> direction of the Group III nitride surface, and the at least one opening exposes at least one portion of the Group III nitride surface. Next, a semiconductor layer is formed over the at least one portion of the Group III nitride surface and each wing region of the patterned release layer by lateral epitaxial overgrowth. The semiconductor layer has a corrugated bottommost surface provided with a plurality of indentations, and each of the indentations encloses a respective one of wing regions. Next, one or more stressor layers on an upper surface of the semiconductor layer is formed. The tensile stress in the one or more stressor layers is configured to cause at least one fracture in the wing regions. At least a portion of the semiconductor layer and a portion of the wing regions enclosed therein are removed from the base substrate at the at least one fracture.

In another aspect of the present disclosure, a method of forming a semiconductor structure is provided. The method includes forming a release layer over a base substrate. The release layer is in contact with a Group III nitride surface. A patterned release layer that includes at least one opening and a plurality of wing regions is then formed. Each wing region is oriented along a <1$\bar{1}$00> direction of the Group III nitride surface, and the at least one opening exposes at least one portion of the Group III nitride surface. Next, a semiconductor layer is formed over the at least one portion of the Group III nitride surface and each wing region of the patterned release layer by lateral epitaxial overgrowth. The semiconductor layer has a corrugated bottommost surface provided with a plurality of indentations, and each of the indentations encloses a respective one of wing regions. The wing regions are then removed to provide a plurality of cavities. Next, one or more stressor layers are formed over the semiconductor layer. The tensile stress in the one or more stressor layers is configured to cause at least one fracture initiated in a lower portion of the semiconductor layer regions having the cavities. At least a portion of the semiconductor layer is removed from the base substrate at the at least one fracture.

DETAILED DESCRIPTION

Figure 1:
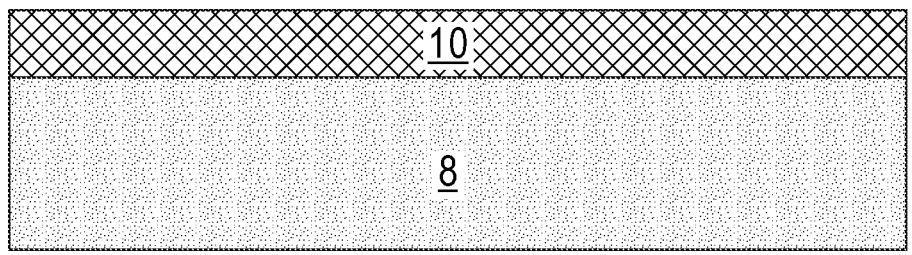
FIG. 1 is a cross-sectional view illustrating an initial structure including a base substrate and a buffer layer formed thereon that can be employed in embodiments of the present disclosure.

The present disclosure will now be described in greater detail by referring to the following discussion and drawings that accompany the present disclosure. It is noted that the drawings are provided for illustrative purposes only and are not drawn to scale. It is further noted that like elements shown in the drawings are referred to by like reference numerals.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or base substrate is referred to as being "on" or "over" another element, it can be directly on the other element or intervening elements may also be present. In contrast, when an element is referred to as being "directly on" or "directly over" another element, there are no intervening elements present.

Referring to FIG. 1, there is illustrated an initial structure that can be employed in an embodiment of the present disclosure. The initial structure includes a base substrate 8 having a buffer layer 10 formed thereon.

In some embodiments of the present disclosure and as shown in FIG. 1, the base substrate 8 can comprise a semiconductor material including for example, silicon, silicon carbide, an III-V compound semiconductor material, or a multilayered stack thereof. The term "III-V compound semiconductor" as used throughout the present disclosure denotes a semiconductor compound that is composed of at least one element from Group III of the Periodic Table of Elements and at least one element from Group V of the Periodic Table of Elements. III-V compound semiconductor materials that can be employed as base substrate 8 may comprise a binary, i.e., two elements, III-V compound semiconductor, a ternary, i.e., three elements, III-V compound semiconductor or a quaternary, i.e., four elements, III-V compound semiconductor. III-V compound semiconductor materials containing greater than four elements can also be used as base substrate 8. Examples of III-V compound semiconductor materials that can be employed as base substrate 8 include, but are not limited to, GaN, GaAs, InP, AlAs, GaSb, InGaAs, InGaN, InGaP, AlInGaP, and AlInGaSb.

In other embodiments of the present disclosure, the base substrate 8 can comprise an electrically nonconductive material, such as sapphire, i.e., $Al_2O_3$.

The base substrate 8 can have a thickness from 5 μm to 2 cm, although lesser and greater thickness can also be employed.

The buffer layer 10 includes a Group III nitride material which varies depending on the type of the base substrate material. The term "Group III nitride" as used throughout the present disclosure denotes a compound of nitrogen and at least one element from Group III, i.e., aluminum (Al), gallium (Ga) and indium (In), of the Periodic Table of Elements. Exemplary Group III nitride materials that can be employed as the buffer layer 10 include, but are not limited to, GaN, AlN, AlGaN, GaAlN, and GaAlInN. For example, and when the base substrate 8 is composed of silicon, the buffer layer 10 is typically comprised of AlN. When the base substrate 8 is composed of either sapphire or SiC, the buffer layer 10 can be comprised of AlN, GaN, or AlGaN. In some embodiments, especially, when a Group III nitride material itself, e.g. GaN, is used as the base substrate 8, the step of forming the buffer layer 10 can be eliminated.

The buffer layer 10 can be formed by introducing an organo-Group III element containing precursor such as, for example, an organoaluminum precursor (i.e., a trialkylaluminum compound), or an organogallium precursor (i.e., a trialkylgallium compound) or a mixture thereof, and a nitride precursor such as, for example, ammonium nitride into a reactor chamber of a metalorganic chemical vapor deposition (MOCVD) apparatus. MOCVD may be carried out with or without a plasma enhancement provision. An inert carrier gas may be present with one of the precursors used in forming the buffer layer, or an inert carrier gas can be present with both the precursors used in forming the buffer layer 10. The buffer layer 10 is typically formed at a temperature of 500° C. or greater. In one embodiment, the deposition of the buffer layer 10 typically occurs at a temperature from 650° C. to 850° C. In another embodiment, the deposition of the buffer layer 10 typically occurs at a temperature from 850° C. to 1050° C. Notwithstanding the temperature in which the buffer layer 10 is formed, the deposition of the buffer layer 10 is performed for a time period of 1 minute to 20 minutes. The buffer layer 10 that is formed typically has a thickness from 10 nm to 2 μm, although lesser and greater thicknesses can also be employed.

Figure 2:
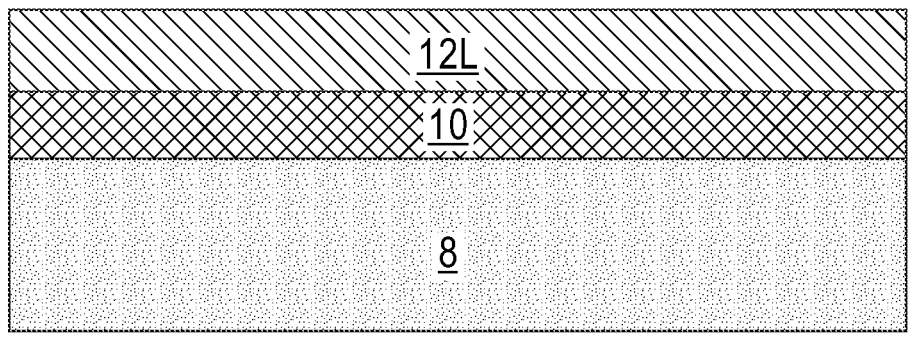
FIG. 2 is a cross-sectional view of the initial structure of FIG. 1 after forming a release layer on the buffer layer.

Referring to FIG. 2, there is illustrated the structure of FIG. 1 after forming a release layer 12L on the buffer layer 10. Alternatively, the release layer 12L can be directly formed on the base substrate 8 if the base substrate 8 is composed of a Group III nitride material (not shown). The release layer 12L is thus in contact with a Group III nitride surface which may be either an upper surface of the buffer layer 10 or an upper surface of the base substrate 8. The release layer 12L is a continuous layer that covers the entire upper surface of the buffer layer 10 and is employed in the present disclosure to control the location in which crack initiation and subsequent propagation occurs. The release layer 12L may comprise a single release layer or a multilayered structure including at least two layers of different materials.

In some embodiments of the present disclosure, the release layer 12L includes any material having a lower fracture toughness value ($K_{Ic}$) than that of a material of the base substrate and that of a material of a semiconductor layer to be subsequently formed. Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero, and mode III stress (tearing) is generally absent from the loading conditions. Fracture toughness is a quantitative way of expressing a material's resistance to brittle fracture when a crack is present.

In other embodiments, the release layer 12L includes any material that can be removed selective to the Group III nitride material and a material of a semiconductor layer to be subsequently formed. As used herein, the term "selective" in reference to a material removal process denotes that the rate of material removal for a first material is greater than the rate of removal for at least another material of the structure to which the material removal process is being applied. For example and in one embodiment, a selective etch may include an etch chemistry that removes a first material selectively to a second material by a ratio of 10:1 or greater.

In addition, materials that can be employed as release layer 12L need to be stable at the III-V compound semiconductor thin film growth temperature (typically as high as 1100° C.). Examples of materials that can be used as release layer 12L include, but are not limited to, a dielectric oxide, a dielectric nitride, a dielectric oxynitride, and combinations thereof. In one embodiment, the release layer 12L is composed of a dielectric oxide such as silicon oxide or hafnium oxide, while in another embodiment the release layer 12L is composed of a dielectric nitride such as silicon nitride.

The release layer 12L can be formed on the buffer layer 10 by a conventional deposition process including, but not limited to, chemical vapor deposition (CVD), plasma enhanced chemical vapor deposition (PECVD), chemical solution deposition, evaporation, and physical vapor deposition (PVD). In one embodiment, the release layer 12 is formed by PECVD at 300° C. The thickness of the release layer 12L can be from 50 nm to 300 nm, although lesser and greater thickness can also be employed.

Figure 3:
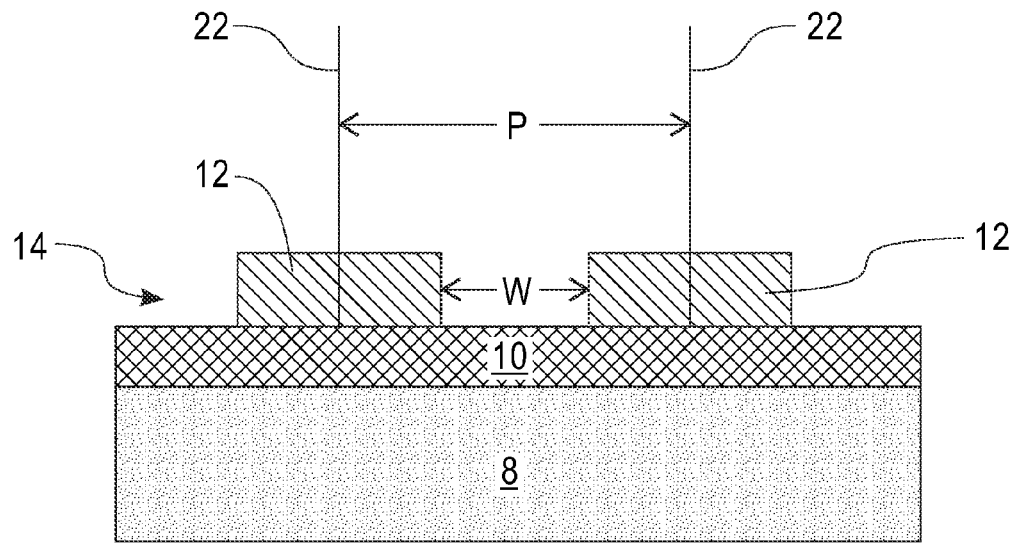
FIG. 3 is a cross-sectional view of the structure of FIG. 2 after patterning the release layer.

Referring to FIG. 3, there is illustrated the structure of FIG. 2 after patterning the release layer 12L along a <1$\bar{1}$00> direction of the underlying Group III nitride surface (i.e., the upper surface of the buffer layer 10, or the upper surface of the base substrate 8 when no buffer layer 10 is present). The patterning forms multiple wing regions 12 (i.e., the remaining portions of the release layer 12L) oriented along the <1$\bar{1}$00> direction that are separated from each other by openings 14. The pattern may be formed in a periodic or aperiodic fashion. The openings 14 expose portions of the underlying Group III nitride surface, and are characterized in that they have a width (w), as measured from one sidewall of one opening 14 to another sidewall of the opening 14, of from 0.1 μm to 10 μm. The distance between midpoint planes 22 of two adjacent wing regions 12 is defined herein as a period (p) of the pattern, and the period of the pattern formed in the present disclosure can range from 0.2 μm to 15 μm. The ratio of the width to the period can be defined as any value, although a smaller ratio value is generally more desirable for release and a larger ratio value is generally desirable for epitaxial growth time minimization.

In one embodiment of the present disclosure, and when the base substrate 8 is composed of sapphire and the buffer layer 10 is a 2 μm-thick GaN layer, the release layer 12L is patterned along the <1$\bar{1}$00> direction of the GaN surface to form a patterned structure with an opening width of 2 μm and a period of 15 μm.

The patterning of the release layer 12L can be carried out by a combination of lithography and etching processes. The lithographic process can include forming a photoresist (not shown) atop the release layer 12L, exposing the photoresist to a desired pattern of radiation and developing the exposed photoresist utilizing a conventional resist developer. The pattern is then transferred into the release layer 12L by etching.

The etching can include a dry etching process (such as, for example, reactive ion etching, ion beam etching, plasma etching or laser ablation), and/or a wet chemical etching process. Typically, reactive ion etching is used to transfer the pattern from the developed photoresist into the release layer 12L. After patterning, the patterned photoresist can be removed utilizing a conventional stripping process such as, for example, ashing.

Figure 4:
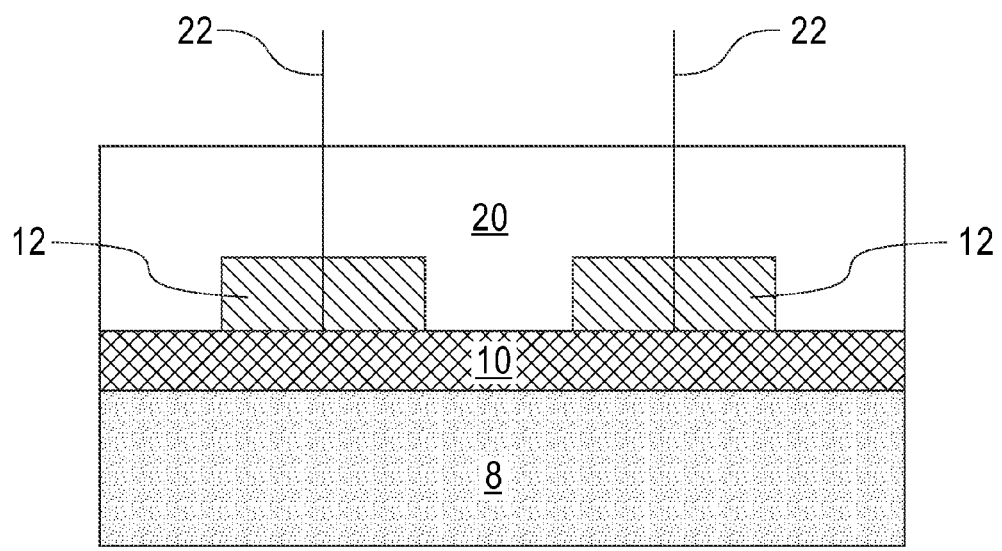
FIG. 4 is a cross-sectional view of the structure of FIG. 3 after forming a semiconductor layer over the patterned release layer and the buffer layer by lateral epitaxial overgrowth.

Referring to FIG. 4, there is illustrated the structure of FIG. 3 after forming a semiconductor layer 20 over the patterned release layer and exposed portions of the buffer layer 10 (i.e., over exposed surfaces at bottoms of openings 14 and wing regions 12). The semiconductor layer 20 that is formed has a corrugated bottommost surface with multiple indentations, and each of the indentations encloses a respective wing region therein. The semiconductor layer 20 employed in the present disclosure comprises an III-V compound semiconductor material. Examples of III-V compound semiconductor materials that can be employed as semiconductor layer 20 include, but are not limited to, GaSb, GaP, GaAs, InAs, InP, AlN, InN, GaN, GaAlN, and GaAlInN. In one embodiment, the semiconductor layer 20 is composed of GaN.

A lateral epitaxial overgrowth growing method is used to form the semiconductor layer 20 starting at bottoms of openings 14, i.e., exposed portions of the upper surface of the buffer layer 10 or the upper surface of the base substrate 8 when the buffer layer 10 is not present. The deposited material grows vertically in the openings 14 to the top of wing regions 12 and then laterally over the wing regions 12. The growth is allowed to proceed both vertically and horizontally until the lateral growth fronts from adjacent wing regions coalesce at midpoint planes 22 to form a continuous layer, i.e., the semiconductor layer 20. The semiconductor layer 20 that is formed typically has a low density of defects.

The wing regions 12 of patterned release layer weaken the normally robust epitaxial growth of the III-V compound semiconductor material. As a result, the semiconductor layer 20 produced by the lateral epitaxial overgrow process is suspending over the wing regions 12 of patterned release layer.

The lateral epitaxial overgrowth of the semiconductor layer 20 can be carried out by using any well-known method such as MOCVD or CVD. The semiconductor layer 20 that is formed typically has a thickness from 0.5 μm to 5 μm, although lesser and greater thickness can also be employed. The thickness of the semiconductor layer 20 is typically 10 to 50 times of the thickness of the release layer 12L.

Figure 5:
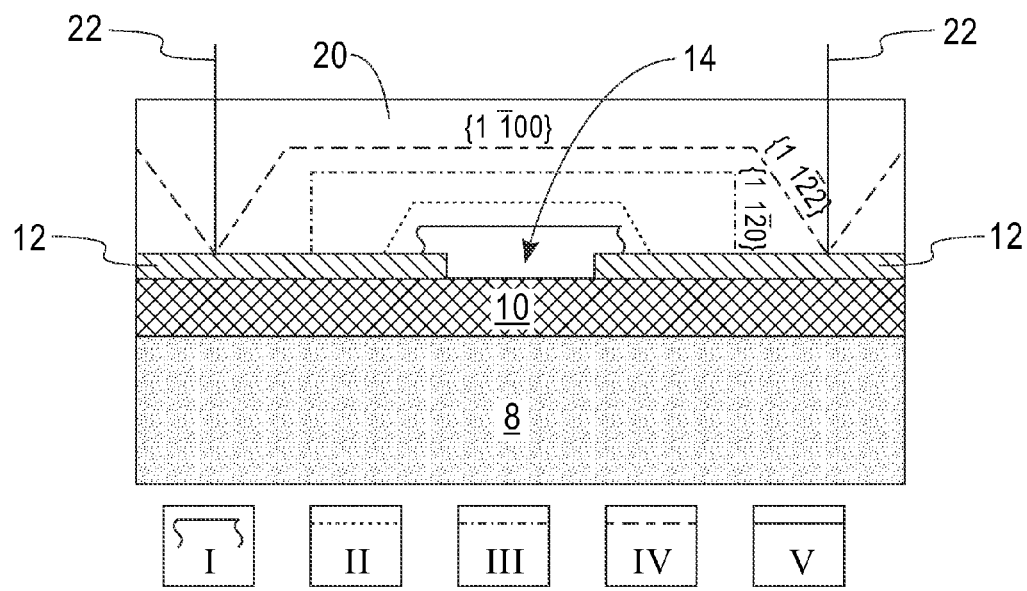
FIG. 5 is a pictorial representation (through a cross sectional view) illustrating a five-step lateral epitaxial overgrowth process for forming the semiconductor layer of FIG. 4.

Referring to FIG. 5, there is illustrated a five-step lateral epitaxial overgrowth process for forming the semiconductor layer 20 of FIG. 4. The semiconductor layer 20 can be fabricated by first growing an III-V compound semiconductor material vertically in the openings 14 (Step I). At step I, growth parameters such as growth temperature, V/III element ratio, effective lateral to vertical growth rate ratio and growth time are selected to create an initial well-formed buffer on the exposed portions of the upper surface of the buffer layer 10 from which the vertical growth of III-V compound semiconductor material will progress. Once the deposited material has been grown to a thickness larger than the thickness of the release layer 12L, at Step II, the growth conditions are adjusted to favor both lateral and vertical growth in order to obtain straight side walls. At the end of Step II, {11$\bar{2}$2} facets with inclined sidewalls can be formed. Stage III is the lateral growth phase, during which the growth conditions are adjusted so that the lateral to vertical (L/V) growth rate is enhanced, for example, by increasing the growth temperature. At the end of Step III, the initially inclined {11$\bar{2}$2} sidewalls are replaced with vertical {11$\bar{2}$0} sidewalls. Stage IV is the coalescence step; and after the distance between the side walls is close enough, the sidewall slope is increased in order to realize a void free coalescence front. At the end of Step IV, {11$\bar{2}$2} facets with inclined sidewalls can be formed. At State V, the conventional Group III-V compound semiconductor growth conditions are used so that the vertical growth is promoted.

In one embodiment of the present disclosure, a GaN semiconductor layer is formed by the lateral epitaxial overgrowth of GaN on a patterned SiO$_2$ release layer with an opening width of 2 μm and a period of 15 μm utilizing the five-step lateral epitaxial overgrowing process described above.

The semiconductor layer 20 can be processed to include at least one semiconductor device, including, but not limited to, a diode, a transistor, a capacitor, a resistor, and a photovoltaic cell.

Figure 6:
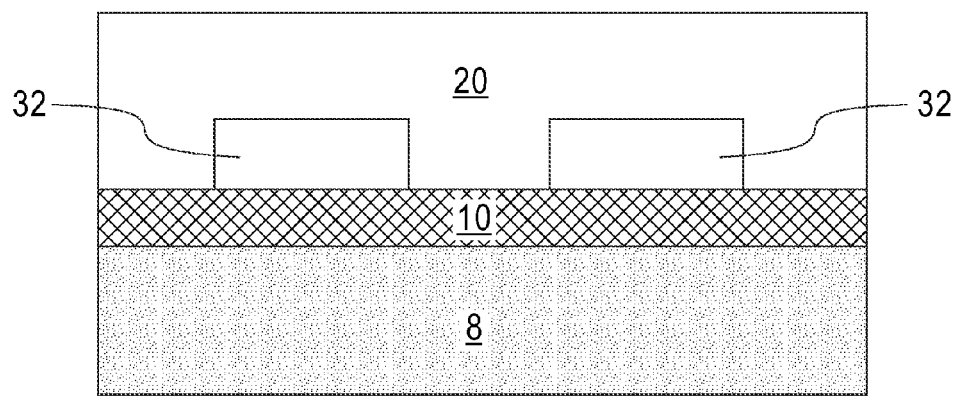
FIG. 6 is a cross-sectional view of the structure of FIG. 4 after removing the patterned release layer to form cavities within the semiconductor layer in accordance with an alternative embodiment of the present disclosure.

Referring to FIG. 6, there is illustrated the structure of FIG. 4 after removing wing regions 12 of patterned release layer to form cavities 32. As is shown, the wing regions 12 can be removed selectively with respect to the semiconductor layer 20 and the buffer layer 10 by etching. The etching can include a dry etching process (such as, for example, reactive ion etching, ion beam etching, plasma etching or laser ablation), and/or a wet chemical etching process. The cavities 32 expose portions of the upper surface of the release layer 10 that are located beneath the wing regions 12. In some embodiments of the present disclosure, this step, i.e., the removal of the wing regions 12 of patterned release layer can be omitted.

Figure 7A:
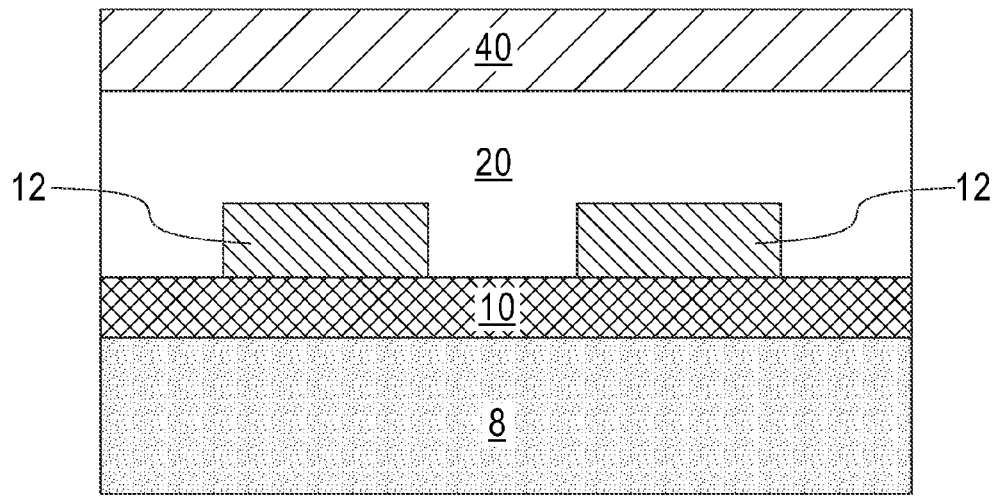
FIG. 7A is a cross-section view of the structure of FIG. 4 after forming a stressor layer atop the semiconductor layer.
Figure 7B:
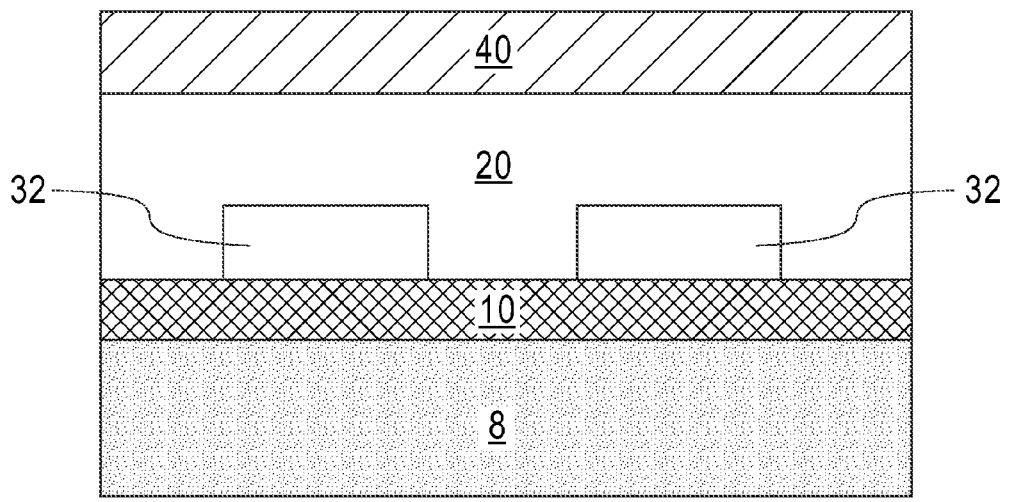
FIG. 7B is a cross-section view of the structure of FIG. 6 after forming a stressor layer atop the semiconductor layer.

Referring to FIGS. 7A-7B, there are illustrated the structure of FIG. 4 and the structure of FIG. 6 after forming a stressor layer 40 atop the semiconductor layer 20, respectively. The stressor layer 40 that can be employed in the present disclosure includes any material that is under tensile stress when applied atop the semiconductor layer 20. Examples of such materials that are under tensile stress when applied atop the semiconductor layer 20 include, but are not limited to, a metal, a polymer, and any combination thereof. The stressor layer 40 may comprise a single stressor layer, or a multilayered stressor structure including at least two layers of different stressor materials.

In one embodiment, the stressor layer 40 is a metal, and the metal is formed on an upper surface of the semiconductor layer 20. When a metal is employed as the stressor layer 40, the metal can include, for example, Ni, Cr, Fe or W. Alloys of these metals can also be employed. In one embodiment, the stressor layer 40 includes at least one layer consisting of Ni.

In embodiments in which a metal stressor layer is employed, a metal-containing adhesion layer can be formed between the metal stressor layer and the semiconductor layer 20. Examples of metal-containing adhesion layers that can be employed include, but are not limited to, Ti/W, Ti, Cr, Ni, and any combination thereof. The metal-containing adhesion layer may comprise a single layer or it may include a multi-layered structure comprising at least two layers of different metal adhesion materials. The metal-containing adhesion layer can be formed utilizing deposition techniques that are well known to those skilled in the art. For example, the metal-containing adhesion layer can be formed by sputtering, chemical vapor deposition (CVD), plasma enhanced chemical vapor deposition (PECVD), chemical solution deposition, physical vapor deposition (PVD), and plating. When sputter deposition is employed, the sputter deposition process may further include an in-situ sputter clean process before the deposition. When employed, the metal-containing adhesion layer typically has a thickness of from 5 nm to 200 nm, with a thickness of from 100 nm to 150 nm being more typical. Other thicknesses for the metal-containing adhesion layer that are below and/or above the aforementioned thickness ranges can also be employed in the present disclosure.

In embodiments in which a metal stressor layer is employed and plating is used to form the metal-containing stressor layer, an optional plating seed layer (not shown) can be formed directly atop the uppermost surface of the semiconductor layer prior to forming the metal-containing adhesion layer. The optional plating seed layer is employed to selectively promote subsequent plating of the metal-containing stressor layer. The optional plating seed layer can be used together with the metal-containing adhesion layer or in lieu thereof.

The optional plating seed layer may comprise, for example, a single layer of Ni or a layered structure of two or more metals such as Ti/Ni, Ti/Ag, Ti/Au, Cr/Ni, Cr/Ag, Cr/Au, or Al (bottom)/Ti/Ni (top). The thickness of the optional plating seed layer may vary depending on the material or materials of the optional plating seed layer as well as the technique used in forming the same. Typically, the optional plating seed layer has a thickness from 2 nm to 1 μm. The optional plating seed layer can be formed by a conventional deposition process including, for example, CVD, PECVD, atomic layer deposition (ALD), or PVD techniques that may include evaporation and/or sputtering.

In one embodiment, a polymer is employed as the stressor layer 40. Examples of polymers that can be employed as stressor layer 40 include, but are not limited to, polyimides, polyesters, polyolefins, polyacrylates, polyurethane, polyvinyl acetate, and polyvinyl chloride.

In some embodiments, the polymer may include a spall inducing tape layer. When a spall inducing tape layer is employed as the stressor layer 40, the spall inducing tape layer includes any pressure sensitive tape that is flexible, soft, and stress free at the temperature used to form the tape, yet strong, ductile and tensile at the temperature used during cleaving. By "pressure sensitive tape," it is meant an adhesive tape that will stick with application of pressure, without the need for solvent, heat, or water for activation. Typically, the pressure sensitive tape that is employed in the present disclosure as stressor layer 40 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added. The spall inducing tape can be formed utilizing techniques well known in the art or they can be commercially purchased from any well-known adhesive tape manufacturer. Some examples of spall inducing tapes that can be used in the present disclosure as stressor layer 40 include, for example, Nitto Denko 3193MS thermal cleave tape, Kapton KPT-1, and Diversified Biotech's CLEAR-170 (acrylic adhesive, vinyl base).

When the stressor layer 40 is a metal or polymer, the stressor layer 40 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. When the stressor layer 40 is a spall inducing tape, the spall inducing tape can be applied by hand or mechanical means to the structure.

If the stressor layer 40 is of a metallic nature, it typically has a thickness of from 3 μm to 50 μm, with a thickness of from 4 μm to 7 μm being more typical. Other thicknesses for a metallic stressor layer that are below and/or above the aforementioned thickness ranges can also be employed in the present disclosure. The thickness of the stressor layer 40 may be chosen to provide the desired fracture depth within wing regions 12 of the patterned release layer or cavities 32. For example, if the stressor layer 40 is chosen to be Ni, then fracture will occur at a depth below the stressor layer roughly 2 to 3 times the Ni thickness.

If the stressor layer 40 is of a polymeric nature, it typically has a thickness of from 10 µm to 200 µm, with a thickness of from 50 µm to 100 µm being more typical. Other thicknesses for a polymeric stressor layer that are below and/or above the aforementioned thickness ranges can also be employed in the present disclosure.

An optional handle layer (not shown) may be formed atop the stressor layer 40 to provide better fracture control and more versatility in handling the spalled portion, i.e., the portion of the semiconductor layer 20 below the stressor layer 40. The optional handle layer may have a length that extends beyond the outermost edges of semiconductor layer 20. Moreover, the optional handle layer can be used to guide the crack propagation during the spalling process of the present disclosure. The optional handle layer employed in the present disclosure comprises any flexible material which has a minimum radius of curvature of less than 30 cm such that the handle layer is not too rigid to compromise the spalling process. Examples of the flexible materials that can be employed as the optional handle layer include a metal foil and a polyimide film. In some embodiments, a tape, as described above, can be used as the optional handle layer. The optional handle layer is typically formed at a temperature from 15° C.-40° C.

The optional handle layer can be formed utilizing deposition techniques that are well known to those skilled in the art including, for example, mechanical pressure, dip coating, spin-coating, brush coating, sputtering, CVD, PECVD, chemical solution deposition, PVD, and plating. In some embodiments, the optional handle layer can be a UV-releasable or thermally releasable tape, a polyimide based tape, or other adhesive tapes.

The optional handle layer typically has a thickness of from 5 µm to 500 µm, with a thickness of from 10 µm to 150 µm being more typical, although lesser and greater thickness can also be employed.

Figure 8A:
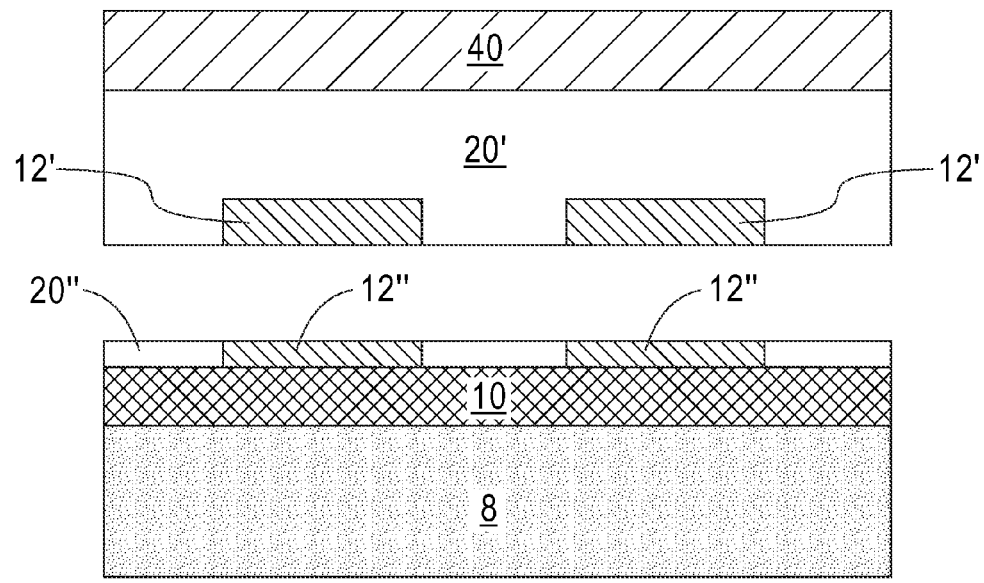
FIG. 8A is a cross-sectional view of the structure of FIG. 7A after removing an upper portion of semiconductor layer from the base substrate by a controlled spalling process.
Figure 8B:
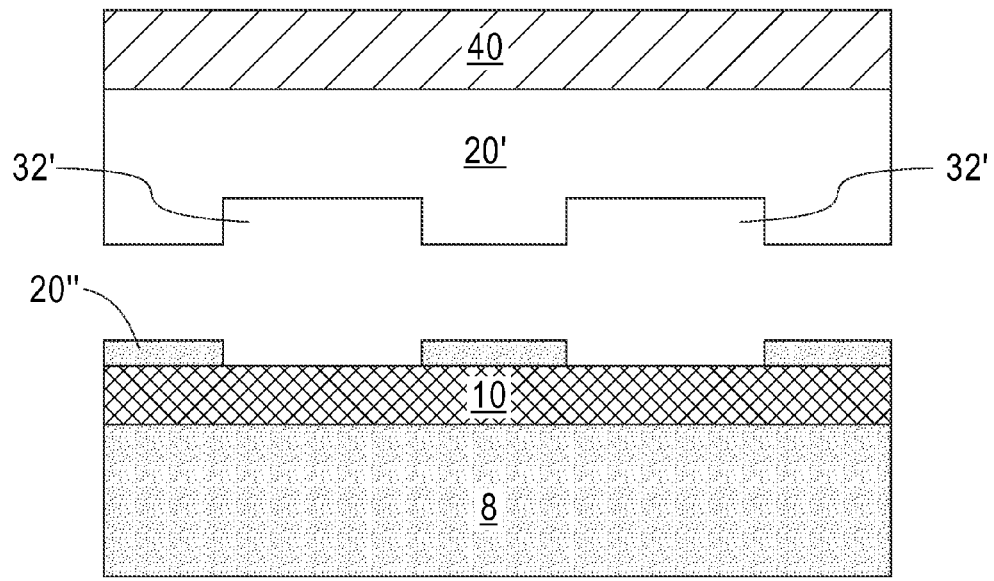
FIG. 8B is a cross-sectional view of the structure of FIG. 7B after removing an upper portion of semiconductor layer from the base substrate by a controlled spalling process.

Referring to FIGS. 8A-8B, there is illustrated the structure of FIGS. 7A-7B, respectively, after removing an upper portion of semiconductor layer 20 from the base substrate 8 by a controlled spalling process. By "controlled spalling process" it is meant that crack formation, propagation and cleaving occur at a plane, which is herein referred to as a spalling plane.

Referring now to FIG. 8A, and in one embodiment of the present disclosure, the structure of FIG. 7A is cleaved along a spalling plane located between a lower portion of the semiconductor layer 20 enclosing wing regions 12 of the patterned release layer and the buffer layer 10. The cracks are initiated at a specific depth of the wing regions 12 and propagate along the spalling plane. The spalling process provides an upper portion which includes a first portion 20' of the semiconductor layer 20 and a first portion 12' of the wing regions 12 and a lower portion which includes a second portion 20" of semiconductor layer 20, a second portion 12" of the wing regions 12, the buffer layer 10 and the base substrate 8.

The upper portion can be cleaved from the lower portion by applying mechanical tensile stress to the structure of FIG. 7A horizontally or vertically (i.e., pulling the upper portion (20', 12') away from the lower portion (20", 12", 10, 8)).

Referring now to FIG. 8B, and in another embodiment of the present disclosure, the structure of FIG. 7B is cleaved along a spalling plane located between a lower portion of the semiconductor layer 20 containing cavities 32 and the buffer layer 10. The spalling process provides an upper portion which includes a first portion 20' of the semiconductor layer 20 and a lower portion which includes a second portion 20" of semiconductor layer 20, the buffer layer 10 and the base substrate 8.

The upper portion can be cleaved from the lower portion by applying mechanical tensile stress to the structure of FIG. 7B horizontally or vertically (i.e., pulling the upper portion (20') away from the lower portion (20", 10, 8)).

Since the semiconductor layer 20 produced by the lateral epitaxial overgrow process is suspending over the wing regions 12 of patterned release layer or cavities 32, an effective area of the semiconductor layer 20 that needs to be fractured is reduced. Moreover, since the release layer 12L is composed of a material having a lower fracture toughness than that of the semiconductor layer 20, the total force needed for mechanical fracture in the present disclosure can be greatly decreased.

The controlled spalling process includes crack formation and propagation which are initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structures are returned to room temperature by allowing the spalled structures to slowly cool up to room temperature by allowing the same to stand at room temperature. Alternatively, the spalled structures can be heated up to room temperature utilizing any heating means.

The optional handle layer (not shown), the stressor layer 40 and the optional metal-containing adhesion layer (not shown) can be removed from the upper portion (i.e., the first portion 20' of semiconductor layer 20 and the first portion 12' of wing regions 12) of the structure of FIG. 8A or the upper portion (i.e., the first portion 20' of semiconductor layer 20) of the structure of FIG. 8B. The removal of those layers can be achieved utilizing conventional techniques well known to those skilled in the art. For example, and in one embodiment, aqua regia ($HNO_3/HCl$) can be used for removing the optional handle layer, the stressor layer 40 and the optional metal-containing adhesion layer from the first portion. In another example, UV or heat treatment is used to remove the optional handle layer, followed by a chemical etch to remove the stressor layer 40, followed by a different chemical etch to remove the optional metal-containing adhesion layer.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
   forming a release layer over a base substrate, wherein the release layer is in contact with a Group III nitride surface and is composed of a dielectric material;
   forming a patterned release layer comprising at least one opening and a plurality of wing regions, wherein each wing region is oriented along a <1$\bar{1}$00> direction of the Group III nitride surface, and wherein the at least one opening exposes at least one portion of the Group III nitride surface;
   forming a semiconductor layer over the at least one portion of the Group III nitride surface and each wing region of the patterned release layer by lateral epitaxial overgrowth, wherein the semiconductor layer has a corrugated bottommost surface provided with a plurality of indentations, each of the indentations enclosing a respective one of wing regions;
   forming one or more stressor layers on an upper surface of the semiconductor layer, wherein a tensile stress in the one or more stressor layers is configured to cause at least one fracture in the wing regions; and
   removing at least a portion of the semiconductor layer and a portion of each of the wing regions enclosed therein from the base substrate at the at least one fracture.

2. The method of claim 1, wherein the release layer has a lower fracture toughness value than the semiconductor layer and the base substrate.

3. The method of claim 1, wherein the release layer comprises a dielectric oxide, a dielectric nitride, a dielectric oxynitride, or a combination thereof.

4. The method of claim 3, wherein the release layer comprises silicon oxide, silicon nitride, or hafnium oxide.

5. The method of claim 1, wherein the semiconductor layer comprises an III-V compound semiconductor material.

6. The method of claim 1, wherein the one or more stressor layers comprise a metal, a polymer, or a combination thereof.

7. The method of claim 1, wherein a width of the at least one opening ranges from 0.1 μm to 10 μm, and wherein a distance between midpoint planes of two adjacent wing regions ranges from 0.2 μm to 15 μm.

8. The method of claim 1 further comprising:
   forming a handle layer on the one or more stressor layers; and
   applying force to the handle layer so as to release the one or more stressor layers, at least a portion of the semiconductor layer, and at least a portion of the wing regions from the base substrate.

9. The method of claim 8, wherein the force is applied in a horizontal direction or a vertical direction.

10. The method of claim 8, wherein the handle layer comprises a metal or a polyimide.

11. The method of claim 1, wherein the Group III nitride surface is provided by forming a buffer layer comprising Group III nitride on the base substrate prior to forming the release layer or by using a base substrate comprising Group III nitride.

12. A method of forming a semiconductor structure comprising:
   forming a release layer over a base substrate, wherein the release layer is in contact with a Group III nitride surface;
   forming a patterned release layer comprising at least one opening and a plurality of wing regions, wherein each wing region is oriented along a <1$\bar{1}$00> direction of the Group III nitride surface, and wherein the at least one opening exposes at least one portion of the Group III nitride surface;
   forming a semiconductor layer over the at least one portion of the Group III nitride surface and each wing region of the patterned release layer by lateral epitaxial overgrowth, wherein the semiconductor layer has a corrugated bottommost surface provided with a plurality of indentations, each of the indentations enclosing a respective one of wing regions;
   removing the wing regions to provide a plurality of cavities;
   forming one or more stressor layers over the semiconductor layer, wherein a tensile stress in the one or more stressor layers is configured to cause at least one fracture initiated in a lower portion of the semiconductor layer regions having the cavities; and
   removing at least a portion of the semiconductor layer from the base substrate at the at least one fracture.

13. The method of claim 12, wherein the release layer comprises a dielectric oxide, a dielectric nitride, a dielectric oxynitride, or a combination thereof.

14. The method of claim 13, wherein the release layer comprises silicon oxide, silicon nitride, or hafnium oxide.

15. The method of claim 12, wherein the semiconductor layer comprises an III-V compound semiconductor material.

16. The method of claim 12, wherein the one or more stressor layers comprise a metal, a polymer, or a combination thereof.

17. The method of claim 12, wherein a width of the at least one opening ranges from 0.1 μm to 10 μm, and wherein a distance between midpoint planes of two adjacent wing regions ranges from 0.2 μm to 15 μm.

18. The method of claim 12, wherein the removing the plurality of the wing regions comprises an etching process.

19. The method of claim 12 further comprising:
   forming a handle layer on the one or more stressor layers; and
   applying force to the handle layer so as to release the one or more stressor layers and at least a portion of the semiconductor layer from the base substrate.

20. The method of claim 12, wherein the Group III nitride surface is provided by forming a buffer layer comprising Group III nitride on the base substrate prior to forming the release layer or by using a base substrate comprising Group III nitride.

* * * * *